US007054798B2

(12) United States Patent
Sorkin

(10) Patent No.: US 7,054,798 B2
(45) Date of Patent: May 30, 2006

(54) PUNCH AND DIE OPTIMIZATION

(75) Inventor: Gregory Bret Sorkin, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 858 days.

(21) Appl. No.: 09/907,753

(22) Filed: Jul. 19, 2001

(65) Prior Publication Data

US 2003/0018401 A1   Jan. 23, 2003

(51) Int. Cl.
G06F 17/10 (2006.01)

(52) U.S. Cl. .......................... 703/2; 700/166
(58) Field of Classification Search .............. 703/2; 219/121.71; 700/166
See application file for complete search history.

(56) References Cited

U.S. PATENT DOCUMENTS 5,293,025 A * 3/1994 Wang .................... 219/121.71
6,006,636 A * 12/1999 Baldwin et al. ............. 83/13
6,023,680 A * 2/2000 Wooster et al. .............. 705/7

OTHER PUBLICATIONS

"Dynamic Programming and the Graphical Traveling Salesman Problem", by Jean Fonlupt et al., 1993, Journal of the ACM, vol. 40 Issue 5.*
"A New Efficient Transformation of Generalized Traveling Salesman Problem into Traveling Salesman Problem" by Arash Behzad and Mohammed Modarres.*

* cited by examiner

Primary Examiner—Paul L. Rodriguez
Assistant Examiner—Dwin M. Craig
(74) Attorney, Agent, or Firm—Stephen C. Kaufman, Esq.; McGinn IP Law Group, PLLC

(57) ABSTRACT

A method of optimizing a manufacturing operation includes receiving as input data a description of a plurality of desired results of the operation, receiving as input data capabilities of a machine to accomplish the operation, determining an operation space including of a set of operations sufficient to accomplish all of the plurality of desired results using the machine capabilities, categorizing the operation space into groups, each group corresponding to one of the plurality of desired results, wherein any operation in the group sufficing to accomplish the corresponding one result, selecting a subset of the operation space, the subset comprising at least one representative from each of the groups, thereby making it sufficient to accomplish all of the plurality of desired results, and determining a short way to sequence the operations from the selected subset.

24 Claims, 8 Drawing Sheets

FIG. 5
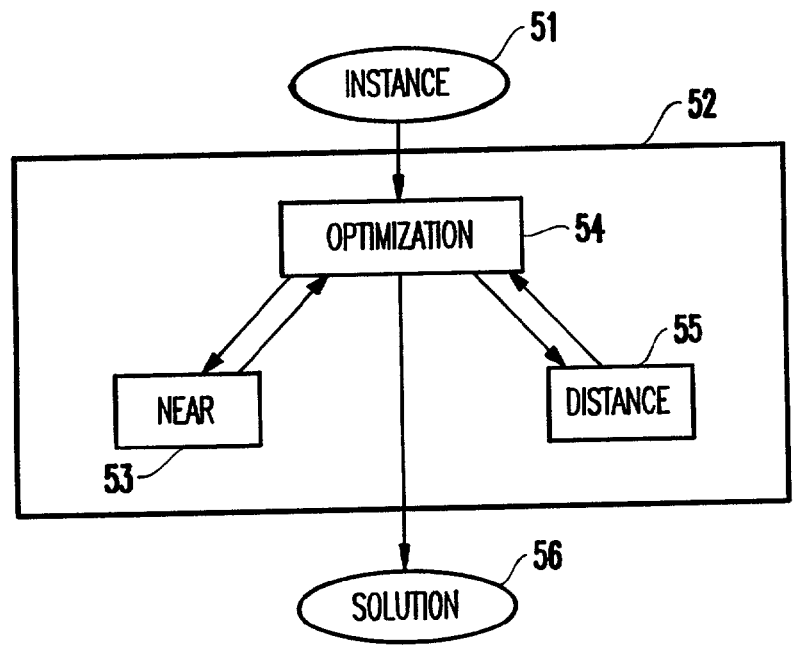
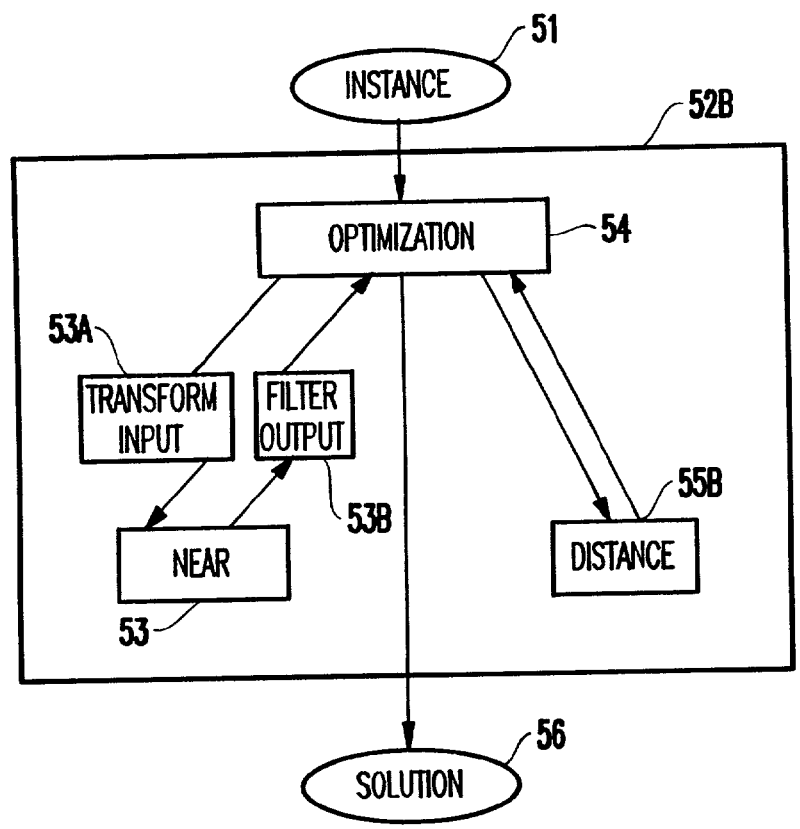

PUNCH AND DIE OPTIMIZATION

BACKGROUND OF THE INVENTION

1. Field of the Invention

The present invention generally relates to a method of optimizing a set of machine operations and/or a machine design. Specifically, an input provides data for the results desired from the eventual manufacturing process and the constraints upon the planned operations or the machine design. An operation space is determined, based on identifying reasonable operations for achieving individual desired results, or a design space is determined by enumerating a class of designs. The operation space is subjected to a selection and/or sequencing process, to yield an efficient set or sequence of operations, or the design space is narrowed by a process of evaluating and filtering designs or by a series of such processes. An exemplary operation-space embodiment addresses optimization of a via hole punching operation for multi-layer ceramic modules (MLCs), in which the selection and sequencing process on the operation space is performed by a solver for the Generalized Traveling Salesman Problem (GTSP). An exemplary design-space embodiment addresses optimization of a die or dice used in the MLC punching operation, in which a die design space is identified and then narrowed by a series of one or more filters, each filter using a different evaluation approach.

2. Description of the Related Art

Multi-layer ceramic modules (MLCs) are a high-performance chip-mounting technology, consisting of layers of ceramic insulator alternating with metallic wiring layers. Electrical contacts between layers are made with "vias", columns of metal passing through one or more ceramic layers. Manufacturing of the vias requires via holes to be punched in each green sheet ("green" refers to the not-yet-fired ceramic material) before the sheets are laminated together). The holes are punched by a numerically controlled (NC) machine that moves a "die" over the green sheet. In current manufacturing practice, in fact, the die is stationary and the sheet is moved, but the difference is immaterial for our purposes, and it is simpler to think in terms of moving the die.

The die bears a set of individually actuatable "punches", also referred to as "pins", at fixed relative locations, and at each stop of the NC machine, those punches aligned with desired hole positions are fired to punch the holes. Individual control of the punches is a powerful degree of freedom allowed by this sophisticated machine.

For each green sheet "part number", a single die is used. Only one die can be mounted in the NC machine at a time, and a green sheet cannot be run through the machine twice, because its alignment holes are damaged by use. Many identical green sheets are typically punched successively before the NC machine is reprogrammed to punch a different green sheet with the same die, or is reprogrammed and fitted with a different die for a different green sheet. There is wide variation, but the time needed to punch a green sheet is typically about a minute, comprised of 1000 punching operations taking about 20 ms each, and a similar amount of travel time from each punch offset to the next.

Due to their high cost, new dice are introduced as rarely as possible. Generally, a die will be matched to some fundamental properties of a design family, in which there is relatively little variation or novelty. To be efficient, it is critical that there be a good match between the die containing the punches and the pattern to be punched. The basic properties are the "pitch" (via positions are typically limited to grid points at this pitch) and "X-up" and "Y-up" numbers.

For example, shown in FIG. 1 is an exemplary 9-up green sheet to eventually be cut into 3×3 identical pieces, each forming say the 17th layer of an MLC. Typically, within each "up block", most or all via separations are multiples of the grid pitch, but the spacing between the ups, dictated by saw kerf, is an incommensurable distance. Superposed on the pattern of 25,659 vias of FIG. 1 is the pattern of the 225 die pins, the pins illustrated as dots twice as large as the via dots. Inset is an enlargement of the path traversed by each pin.

Because the machining equipment is specialized, expensive, and space-consuming, it is desirable to produce each sheet in as little time as possible. Therefore, there remains a need to maximize manufacturing throughput of green sheets, and to minimize costs. The problem is two-fold. First, given a fixed die and a pattern to be punched, there is the problem of how to punch the pattern most efficiently. Second, given a pattern or multiple patterns to be punched, there is a problem of designing a good die or set of dice. The approach discussed in detail herein is equally applicable to other specific examples, such as an automated electronic probe operation or an automated laser trimming operation, as well as a general class of combinatorial manufacturing design problems.

SUMMARY OF THE INVENTION

The present invention solves two basic manufacturing problems. The first is optimization of a set of manufacturing operations, given a tool to perform the operations and the specific results desired. The second is the design of an optimal tool component for an operation, given details of the desired result. The present invention solves the machine operation problem by determining an operation space of reasonable individual operations, then subjecting this space to a selection and/or sequencing process to discover an efficient set or sequence of operations. The present invention solves the machine design problem by determining a design space by enumerating a class of designs, then narrowing this space by a process of evaluating and filtering designs, or by a series of such processes.

In an exemplary embodiment of operation optimization, the operation to be optimized is the MLC via hole punching operation. Given a die and a desired green-sheet pattern, what is the fastest way to punch the pattern with the die? The operation space includes "cities" from which holes may be punched. The selection and sequencing in the operation space is accomplished by a solver for the Generalized Traveling Salesman Problem, in which a subset of cities is determined, providing for all the via hole locations to be punched in the desired pattern, and a sequence within this subset of cities is also determined, allowing for a rapid traversal of the cities.

Thus, the basic concept of a first, "punch optimization" aspect of the present invention is, given data describing desired via locations and a punch die, and desiring to find a means of operating said die to minimize the time to punch said vias, to formulate this minimization problem as a Generalized Traveling Salesman Problem (GTSP) instance, then solving said GTSP instance using any GTSP solver. In a preferred embodiment of the invention, the GTSP is solved first by formulating and solving a "set cover" problem instance, then formulating and solving a standard Traveling Salesman Problem (TSP) instance. There are existing means for solving GTSPs, set cover problems, and TSPs exactly, approximately, or heuristically.

In a second aspect of the invention, information about a via pattern is given, and it is desired to design a die which can punch this pattern in a minimum amount of time. This is achieved by generating a large class of candidate dice, and then using a series of models of the punching operation to select an efficient die.

A third aspect of the invention describes how to modify a solver for a geometric TSP or other geometric problem, adapting it to a metric other than the one for which it was designed.

This exemplary punch operation optimization problem of the present invention is broken down into two parts, which may be addressed separately or together. In any case the division to be disclosed offers conceptual advantages, and, should the parts be solved separately rather than together, it is expected that combining nearly optimal solutions to the separate problems will give a nearly optimal solution to the original problem as well.

The time for the punching operation of a green sheet consists of both travel time as the die (or sheet) is moved by the NC machine table (the time depending on the (x,y) distance moved), and punching time as the pins are fired (a constant amount of time). The GTSP formulation seeks to minimize these two quantities at once. Approaching the GTSP as a set cover problem followed by a TSP corresponds to dividing the problem into two separate parts:

(P1) What is a smallest collection of table positions from which all the vias can be punched? By minimizing this, the number of punch operations and the associated time are minimized.

(P2) Given the positions from (P1), what sequence of these positions minimizes total travel time from position to position? It is possible that a slightly larger set of positions in (P1) could allow "better" positions, resulting in a travel time enough shorter to be worthwhile. We address this possibility by using a weighted set cover in (P1). However, as in well understood in the art of optimization, breaking problems into subproblems often simplifies them, but can also lead to suboptimal solutions.

FIG. 2 shows an overview of the technique 20 used to seek an optimal punching operation as output 25. Desired via pattern data 21 and die data 22 describing a given die are received as input data and in step 23 are used to formulate a GTSP instance 26. This is solved by a GTSP-solving module 24. In a preferred embodiment the GTSP solver 24 comprises a set-cover solver and a TSP solver.

FIG. 2a shows a preferred embodiment of a GTSP solver 24. The GTSP solver 24 comprises step 24C of extracting from the GTSP instance a set-cover instance and solving it with a set-cover solver 24A, followed by step 24D of extracting a corresponding TSP instance and solving it with a TSP solver 24B.

One aspect of the present invention relates to discovering during implementation of this first solution that readily available software TSP solver modules are typically designed around a specific metric so that the module must be modified to the metric of the present operation-space problem. This TSP solver modification may be solved by a technique discussed later. Generalizing this technique, when combinatorial problems such as the exemplary punch operation optimization involve a TSP or GTSP or other geometric problem and a TSP or GTSP or other appropriate solver is provided that is tailored to a specific metric different from the problem-specific metric, it is possible to adapt the TSP or GTSP solver or other appropriate solver to the problem-specific metric.

To solve the second problem of the present invention, a description of the desired result and any constraints related to the tool that will perform the operation are received as input data. From this input data, a design space of reasonable tool design candidates is determined and then the designs within that space are evaluated to select the better possible candidates.

The exemplary design-space embodiment addresses the following question. What die design minimizes the moving and punching time for punching a green sheet? A die design is described by the position of each pin on the die. In cases when the pins have different diameters, the diameter of each pin must also be specified. This problem has natural variants. A die can be optimized with respect to a single green sheet, or a collection of green sheets, for example, all the layers comprising a single MLC design. Because dice are expensive, and new green sheets will be designed in the future, it may also be desirable to optimize a die for a "typical" unknown green sheet with certain basic parameters. By way of example, these basic parameters might include, but are not limited to, grid pitch, "up" pattern, active area, and secondary grid pitches.

It is also possible to fabricate a set of green sheets for one or more MLC designs using more than one type of die. In this case, a multi-criteria optimization problem might be as follows. Given a quantity for each green sheet part number, minimize the total time required to punch the vias, minimize the number of different die types used, and minimize the total quantity of dice used. Another optimization might be, with limited resource in dice and punching time, to come as close as possible to meeting demand for a variety of MLCs, each comprised of given green sheet part numbers. As usual in multi-criteria optimization, natural interpretations would be to fix the number of dice allowed (possibly all different) and minimize the punching time, or to fix the punching time and minimize the number of dice.

MLC die design is performed first by generating a space of designs, and then evaluating these designs by using any or all of a plurality of filters, either alone or in various combinations. Three exemplary filters are discussed. FIG. 3 shows an overview of the technique 30 in which an optimal die design 36 is sought. Input data 31 includes desired via pattern data and any constraints for the die. In the case in which a desired via pattern is not yet known, input data 31 for via data might be simply some basic parameters concerning the future pattern. From this input data 31, various reasonable die designs are generated (step 32). Specifically, as will later be described, this might consist of all regular die designs.

At least one filter, preferably a plurality of filters (three filters 33–35 are shown in a preferred implementation illustrating the concept), is then used as a stand-alone filter or, preferably, in sequential combination to systematically explore the machine design space to arrive at the selected die design 36. The first filter 33 is based on a probabilistic model and is very fast to calculate. It is primarily useful when very little is known about the via pattern. The second filter 34 is a zone covering concept that requires more calculation but is much more accurate than the first filter. The third filter 35 uses the GTSP approach of FIG. 2 to evaluate candidates for an optimal die design.

In view of the above discussion, it is, therefore, an object of the present invention to provide a method for optimizing "combinatorial" machinery, defined as machinery described by a plurality of parameters interacting in complex ways, when there are means of enumerating a reasonable subspace of the parameter space, and when there are one or more models of the machine's use.

It is another object of the present invention to disclose a method of solving combinatorial manufacturing design problems in various applications by first determining a design space and then evaluating and filtering designs from that space until only preferred solutions remain.

It is another object of the present invention to disclose a method of solving combinatorial manufacturing operation problems in various applications by first determining an operation space and then searching for a preferred subset or subsequence of that space implementing the desired operation.

It is another object of the present invention to disclose a method of solving manufacturing combinatorial problems in various applications by first determining an operation space or a design space and then searching that space for preferred solutions.

It is another object of the present invention to disclose a method for solving manufacturing problems in a number of applications by using solvers for either the Generalized Traveling Salesman Problem (GTSP) or Traveling Salesman Problem (TSP).

It is another object of this invention to adapt a geometric solver, for a problem such as TSP, Steiner tree, "k-medians", or other such problems well known in the art, from a metric for which the solver was designed, such as the Euclidean metric, to a different metric, such as the L-infinity norm, or a square-root metric we will introduce subsequently.

It is another object of the present invention to teach a method of adapting a GTSP or TSP solver that is tailored to one metric to a different metric specific to a combinatorial optimization problem such as that of the present invention.

It is another object of the present invention to teach a technique of machine design optimization in which a first means enumerates a list of design candidates and a second means evaluates the list of design candidates to arrive at a selection of one or more preferred designs.

It is another object of the present invention to teach application of this technique for the via-hole-punching operation of green sheets of multi-layer ceramic modules (MLCs)

It is another object of this invention to provide a means for designing a die or set of dice to minimize the time required to punch one or more given green sheets of one or more multi-layer ceramic modules (MLCs).

To achieve the above goals, according to a first aspect of the invention, disclosed is a method of optimizing a manufacturing operation, including receiving as input data a description of a plurality of desired results of the operation, receiving as input data capabilities of a machine to accomplish the operation, determining an operation space comprising a set of operations sufficient to accomplish all of the plurality of desired results using the machine capabilities, categorizing the operation space into groups, each group corresponding to one of the plurality of desired results, wherein any operation in the group sufficing to accomplish the corresponding one result, selecting a subset of the operation space, the subset comprising at least one representative from each of the groups, thereby making it sufficient to accomplish all of the plurality of desired results, and determining a short way to sequence the operations from the selected subset.

According to a second aspect of the invention, disclosed herein is a method of optimizing a via-hole-punching operation for a multi-layer ceramic module including receiving as input data a description of a desired via pattern to be punched, receiving as input data a set of characteristics of a die having a plurality of punch pins, determining an operation space comprising a listing of reasonable offsets of a punch head holding a die with the characteristics that must be used to produce the desired via pattern, defining each offset as a city, and associating with each city the set of all desired vias that may be punched with the die positioned at the city's offset, categorizing the cities into groups, wherein each group is determined by one desired via, and the group consists of all cities with which that via is associated, selecting a subset of cities comprising at least one city from each of the groups, and determining a short tour through the selected cities.

According to a third aspect of the invention, disclosed herein is a method of optimizing a manufacturing tool design including receiving as input data a description of a desired result of an operation of the tool, receiving as input data a description of constraints of the tool design, determining a design space comprising a set of possible tool designs that can accomplish the desired result, and selecting a good design from the design space.

According to a fourth aspect of the invention, disclosed herein is a method of adapting a solver for a geometric optimization problem, wherein the solver consists of a procedure for finding a feasible solution with optimal or near-optimal cost, the cost computed with respect to a solver-specific metric, including executing an analogous procedure for finding a feasible solution with optimal or near-optimal cost, the cost computed with respect to a different, user-specified metric.

According to a fifth aspect of the invention, disclosed herein is a method of modifying a geometric solver having a solver-specific metric to adapt the solver to a problem-specific metric different from the solver-specific metric, the geometric solver having an optimization component, a nearness component receiving as inputs a point x and a distance d, the nearness component then computing all cities y within distance d of x, where the distance d is in a solver-specific metric, and a distance component to compute a solver-specific metric between two points input into the distance component, including replacing the solver-specific distance component with a problem-specific distance component and adding to the nearness the preprocessing component replaces the input distance d with a value f(d), where f(d) is a distance such that where any two points within distance d of one another in the problem-specific metric are always within distance f(d) of one another in the solver-specific metric, and wherein the postprocessing component receives as an input a set of pairs of cities (x,y) and distance d and provides as an output only city pairs (x, y) for which the problem-specific metric distance between x and y is smaller than the input distance d.

BRIEF DESCRIPTION OF THE DRAWINGS

The foregoing and other objects, aspects and advantages will be better understood from the following detailed description of a preferred embodiment of the invention with reference to the drawings, in which:

FIG. 5 shows functional modules in a typical TSP software module, demonstrating another aspect of the present invention of being able to adapt a geometric solver designed for one metric to another metric;

DETAILED DESCRIPTION OF A PREFERRED EMBODIMENT OF THE INVENTION

Figure 1:
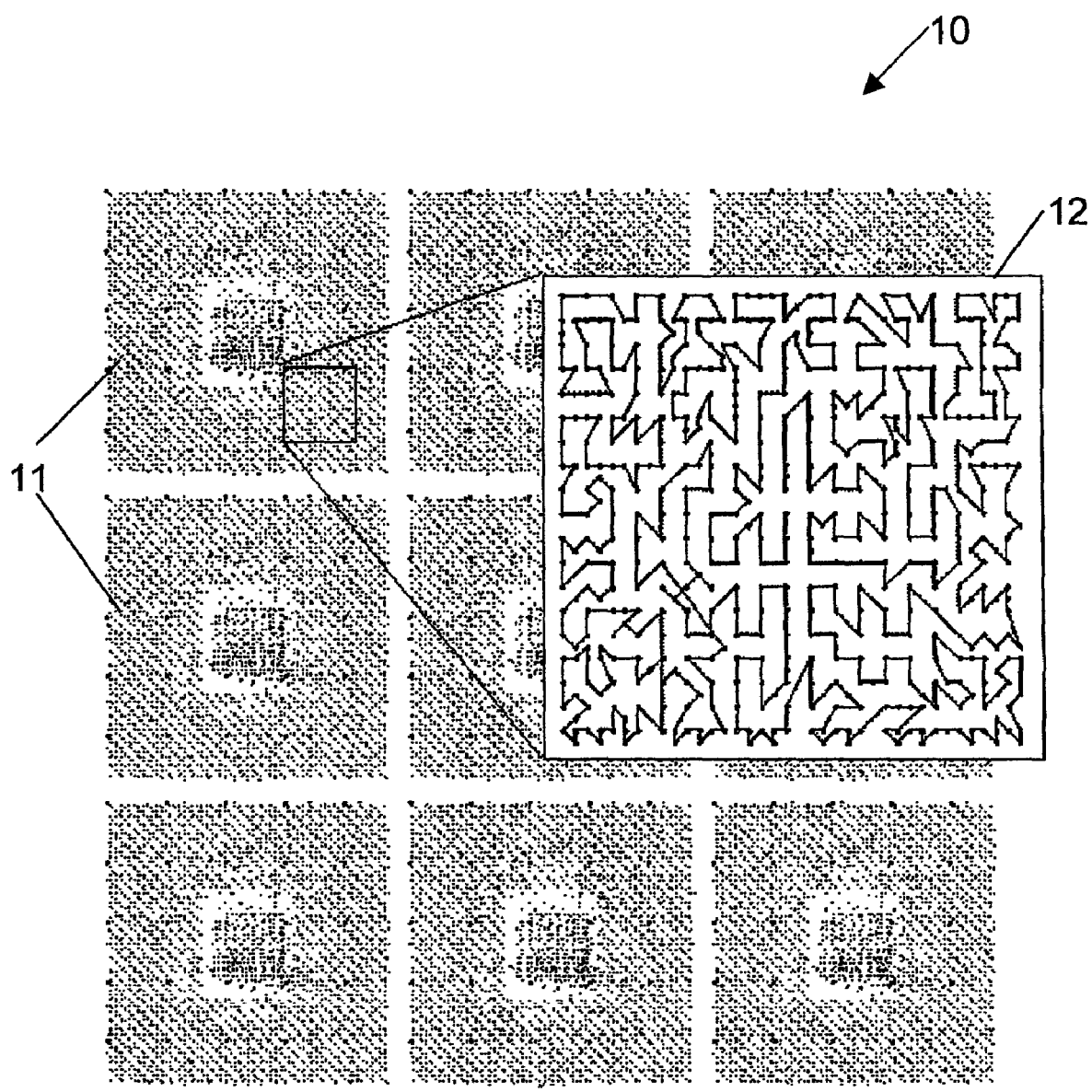
FIG. 1 shows a typical MLC green sheet and superimposed punch pin pattern and inset TSP tour.

Returning to FIG. 2, the general concept of solving a combinatorial problem in accordance with this invention involves the formulation as an instance of the Generalized Traveling Salesman Problem (GTSP), and solution using any appropriate GTSP solver. As shown in FIG. 2A, a preferred implementation uses a set cover solver and a Traveling Salesman Problem (TSP) solver.

In a first exemplary embodiment of the present invention, described with reference to FIG. 2 and FIG. 4, the problems of minimizing the number of punching operations and the travel time between them are considered jointly. This may be formulated as an instance of the "Generalized Traveling Salesman Problem" or "Generalized TSP" or GTSP. A GTSP instance includes a set of "cities", a distance between each pair of cities or a procedure for computing such distances, and also a collection of subsets of cities. A solution to the GTSP instance is a tour that includes at least one city from each subset, and a sole desideratum is to minimize the travel time around the tour.

Corresponding to a punch optimization problem a GTSP instance can be formulated as follows.

1. The "cities" include a list of "reasonable" punch offsets from a "home position" of the punch head, said punch head described by die data 22. By definition, from each offset defined to be a city, it is possible to punch at least one via, said vias described by via data 21. Thus, a city is initially defined as being an offset of the tool head for which at least one via can be punched using a specific corresponding pin in the tool head die.

With each city, the set of all vias that can be punched from that city is associated. In other words, a "city" comprises an offset of the tool head for which at least one via can be punched and a listing of all vias that can be punched at that offset.

Thus, each city would be a listing having the following format:

CITY=x, y, A, B, C, ... D where x and y define the offset and A ... D are indices of vias that can be punched using offset (x, y). It should be obvious that other specific representations and notations could be used.

1a. In one preferred implementation, the list of "city" offsets is generated by all exact alignments of any pin with any via (eliminating combinations which are infeasible because they violate constraints such as a maximum-offset constraint). It is straightforward to generate this list by iterating through all pin positions and via positions, but alternatively, more efficient geometric algorithms may be employed.

1b. Alternatives to the exact alignment of the first implementation (1a) above may be useful. It may be allowable for a pin to punch a via even when the pin's (nominal) position does not exactly match the desired via position, but deviates from it by less than some tolerance distance in a specified norm, such as the L-2 "Euclidean" norm, the L-1 "Manhattan" norm, or the L-infinity "max" norm, or other desired norm. Thus, it might be the case that some sets of pins and vias can be brought into approximate alignment by some offset that does not exactly align any pin with any via, and that the same set of alignments could not be achieved by any offset which exactly aligns any pair.

In a second preferred implementation, the list of "city" offsets includes one representative offset for each maximal set of pin-via alignments. The offsets for (1b) consist of offset "centers" around each of which a "disk" (in the specified norm, and of radius equal to the allowed tolerance) encompasses a maximal subset of the set of offsets of (1a).

Without loss of generality each maximal disk is determined by two of the offsets (1a). For example, in an L-infinity norm, where disks are axis-aligned squares, each square is determined by an input point (1a) on its top edge and a second such point on its left edge. By iterating through pairs of the input points (1a) it is thus straightforward to generate a set of disks which includes all maximal disks, and corresponding centers, providing a solution to (1b).

(2) Whatever city offsets used, for example (1a) or (1b), for each city a list of vias is generated that may be punched from that city. In (1a), it suffices to use information already generated: if the offset of city X was repeatedly generated by vias A, B, and C, then each of these vias can be punched from city X. In case (1b) or in general, because exact alignments may not be realized, geometric algorithms may be needed. In a preferred implementation, for each via, we produce a list of "via" offsets from which that via can be punched with exact alignment; these offsets are "tagged" with the via's identity.

It now suffices to find, for each city offset, all nearby "via" offsets. If the allowable threshold is x, an efficient solution is as follows. With each city offset, associate the nearest points, in each of four directions NW, NE, SE, SW, on an origin-centered grid of pitch 2x. If a point's coordinate is exactly equal to a grid coordinate, it may be treated as if it is just larger.

With each "via" offset, similarly associate the four nearest gridpoints. Any "city" and "via" offset within x of one another will share some associated gridpoint. Sort the gridpoints lexicographically. For each gridpoint, each associated via offset is a candidate for being covered by each associated city offset. Some city offsets generated by this method may fail to cover candidate vias, since distances may be more than x (for example, up to 8x in the L-infinity norm). Thus for each city offset, the distance to each candidate via is computed, and vias at distances greater than x are eliminated to produce the desired city-via list.

By sorting on vias, the list may be inverted to give a list, for each via, of the cities from which it may be punched. This defines the city-subsets of the GTSP. If a via cannot be punched from any position, then the instance is infeasible;

under the constructions (1a) or (1b), this unfeasibility means that it is impossible to punch the desired vias with the specified die.

3. The distance between each pair of cities is the time required to move between the corresponding offsets, plus the time required for one punching operation. These times are computed via a machine-specific model.

Figure 2:
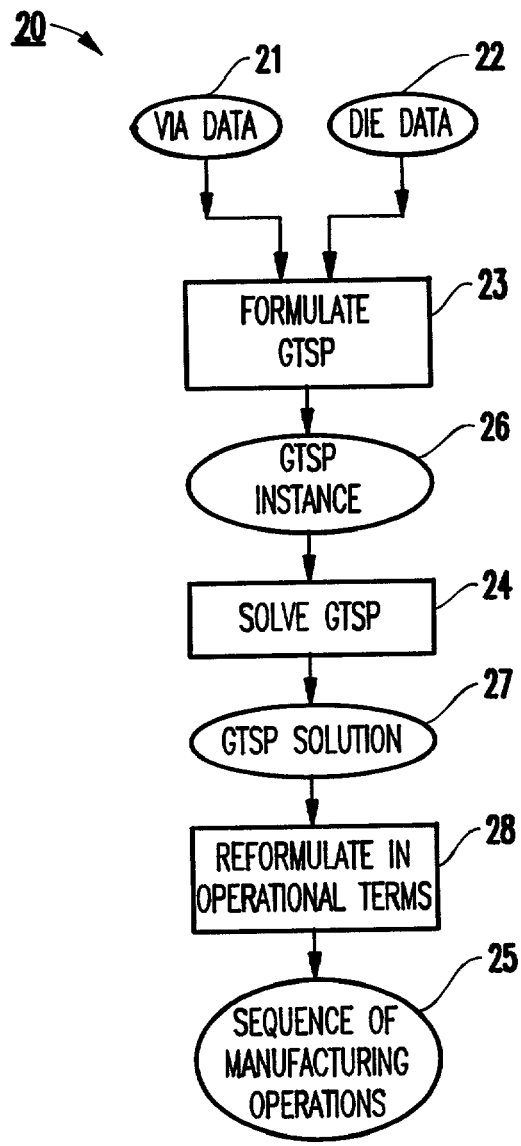
FIGS. 2 and 2A show a flow diagram summarizing an exemplary embodiment of the first aspect of the present invention in which an improved MLC punch operation is sought for a given via pattern and a given die.
Figure 2A:
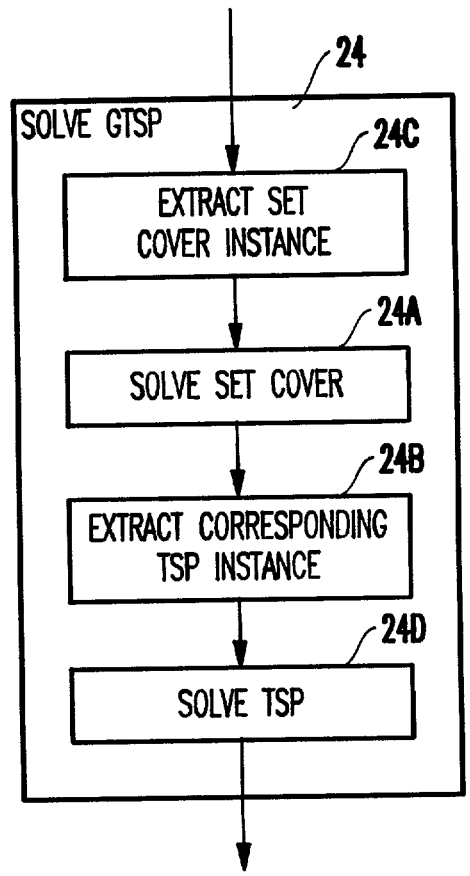
Figure 3:
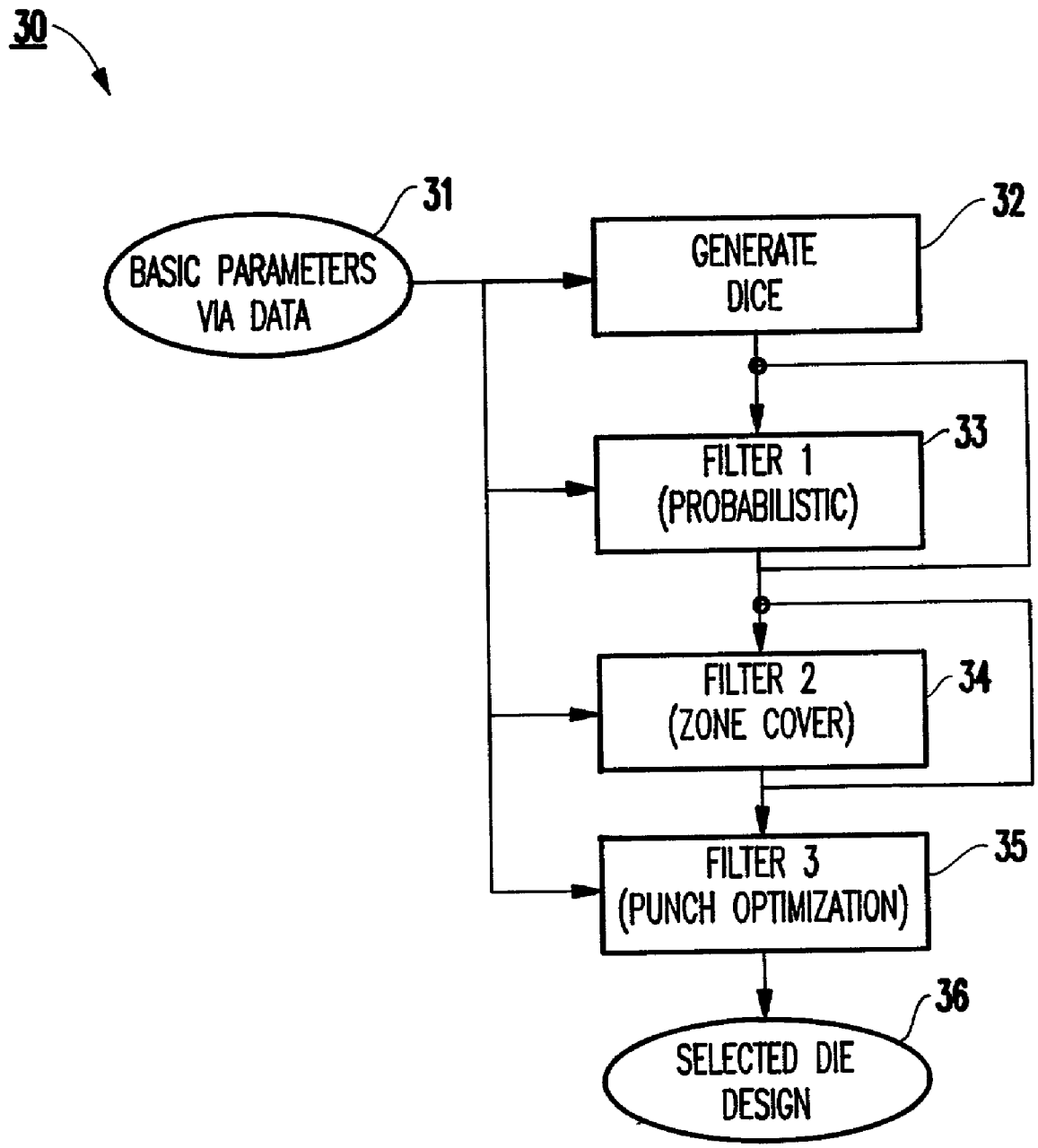
FIG. 3 is a flow diagram summarizing an exemplary embodiment of the second aspect of the present invention in which an optimal die design is sought for a given MLC via pattern.

The foregoing steps (1), (2), and (3), comprising module 23 of FIG. 2, describe the construction, from die and via input data 21 and 22, of data 26 defining a GTSP instance.

Once the GTSP is formulated, it may be solved with any preferred solver 24. In a preferred implementation, the GTSP may be formulated as an integer program (IP) and solved with Branch-Cut-Price heuristics. These heuristics could be applied in a manner producing an approximately optimal solution, rather than an exactly optimal solution, with corresponding savings in solution time. The term "solver" here refers to a means of producing a feasible solution which may or may not be exactly optimal solution but is typically at least nearly optimal; stronger properties may be guaranteed, depending on the solver.

After the GTSP is solved, the solution 27 is in step 28 reformulated in problem-specific, operational terms. For example, the sequence of cities to be visited may be described in terms of a sequence of motions from each city to the next, and the vias associated with each city may be described in terms of commands to fire the pins to punch them. This is a straightforward transformation 28 of the GTSP solution 27 to a machine command sequence 25.

We have now described one embodiment of the first punch optimization aspect of the invention. In lieu of the first GTSP solver described above, we will next describe a preferred alternative GTSP solver.

In a preferred implementation summarized by FIG. 2A, the GTSP is solved using a set cover solver and a TSP solver. The GTSP solver 24 comprises step 24C of extracting from the GTSP instance a set-cover instance and solving it with a set-cover solver 24A, followed by step 24D of extracting a corresponding TSP instance and solving it with a TSP solver 24B, these steps to be detailed shortly. A disadvantage of this second embodiment is that there may be a loss in overall solution quality. An advantage is that (although the GTSP is a standard problem—a Google Internet search yields 87 hits) the individual problems formulated instead—a normal Traveling Salesman Problem or "TSP", and a "Set Cover" problem—are more familiar, and solution methods are readily available. It should be noted that the GTSP, TSP, and Set Cover are all NP-hard optimization problems. That is, as a mathematical matter, it is believed that none can be solved "in polynomial time". As commonly interpreted, they cannot generally be solved exactly in a feasible amount of time, so instead one often settles for solutions which are approximately optimal.

A set cover problem is defined by a collection of subsets over some ground set. A solution is a sub-collection of subsets such that every ground set element belongs to ("is covered by") at least one of the chosen subsets. An optimal solution is one in which the sub-collection includes as few subsets as possible. A "weighted" set cover problem can also be considered, in which a weight or cost is associated with each subset, and an optimal solution is one with minimum-possible total weight. Corresponding to a punch problem instance, a weighted or unweighted set cover instance is formulated as follows.

A GTSP instance 26 includes a set of cities, and collections of cities where at least one city in each collection must be visited. For each city, let the collections it "satisfies" define a subset. These subsets define a set cover instance 24C. In the punch-specific interpretation, these sets correspond to sets of vias covered by one city offset.

An (approximately) optimal solution to the instance yields an (approximately) minimum number of subsets comprising all the vias, and in turn a minimum number of offsets (the positions of the cities corresponding to the selected subsets) from which all vias can be punched.

In an effort to minimize the travel time between the selected offsets, in a preferred implementation, associated with each city is a cost of 1 plus an amount proportional to the city's distance from the machine origin (offset=0). The constant of proportionality is chosen so that the largest cost is not much larger than one, say 1.1. As a result, the dominant desideratum in finding a low-cost solution to the weighted set cover instance will remain that of minimizing the number of subsets selected (because 1 is the dominant component of each cost), but a secondary desideratum is that the offsets corresponding to the selected subsets be close to the origin, and thus close to one another, helping to minimize travel time.

The set cover or weighted set cover instance may be solved 24A by any preferred method. As with the GTSP, it may be formulated as an IP and solved by a technique such as Branch-Cut-Price.

Specifically, a natural IP formulation associates with each subset i a variable $X\_i$ indicating whether the subset is to be selected ($X\_i=1$) or not ($X\_i=0$). Constrain each $X\_i$ to be either 0 and 1, and further constrain that for each ground set element z, over subsets i containing z, the sum of the $X\_i$'s is at least 1. Minimize the sum of the $X\_i$'s.

Alternatively, the set cover problem may be solved by a heuristic such as a greedy algorithm. One exemplary greedy algorithm is as follows. Initially all ground set elements are uncovered. While any uncovered elements remain, for each subset compute the ratio of number of as-yet uncovered elements in the subset to the subset's cost. Choose a subset with maximum ratio, mark its elements as covered, and repeat.

Alternatively, the set cover problem may be relaxed to a linear program (LP) and solved by a heuristic such as the simplex algorithm or an interior point method. Specifically, the LP formulation is the same as the IP formulation described above, except that the constraint that each $X\_i$ be either 0 or 1 is replaced by the constraint that each $X\_i$ lie between 0 and 1. In a preferred implementation, the LP is solved exactly.

If the LP solution happens to yield integral values for the $X\_i$'s, these are used as the set cover solution, which is then guaranteed to be optimal. If some values $X\_i$ are fractional, the cost yielded by the LP solution is a lower bound on the cost of a feasible solution. Changing fractional values $X\_i$ to 1 yields a feasible solution. If this solution is much more costly than the lower bound, then a heuristic solution may also be computed, and the cheaper of the two solutions selected.

In practice it has been found that in a wide variety of conditions, the LP solution is integral, meaning that an exactly optimal solution is produced efficiently, and with a "certificate" that the solution is best possible. Such a certification, not produced by the greedy algorithm described, is independently useful.

The set covering procedure 24A produces a set of subsets corresponding to cities in the GTSP instance. These selected cities define a TSP instance, the city locations and intercity distances being inherited by the TSP from the GTSP. In the punch optimization setting, the location of a city is the punch offset which covered the via subset, and the distance between two cities is the time required to move from one offset to the other. The TSP may be solved 24B by any preferred method.

As described for the GTSP, the TSP may be solved as an IP. However, in a preferred implementation heuristic methods were used. In particular, an initial construction heuristic was used, followed by an iterative improvement procedure. The construction may be any of nearest-neighbor tour, grand tour, or random tour, but is not restricted to these. The improvement heuristic may be to make 2-opt moves, k-opt moves for k>2, or Lin-Kernighan moves, but is not restricted to these. Another possibility is to accept the constructive solution with no improvements.

For efficiency, both construction and improvement heuristics rely on "local" operations, such as being able to find points near a given point. These in turn rely on "geometric" data structures and algorithms, which in turn are typically predicated on a standard metric such as the Euclidean metric. It may be difficult or impossible to modify available geometric procedures to use an application-specific norm, especially since that norm might be given by a "black-box" procedure, i.e., a program for calculating the distance between two points, but not a simple closed-form mathematical expression.

However, different norms can often be related. In the present case, the time it takes the machine to move from (x1, y1) to (x2, y2) is modeled as max(c1 sqrt(|x1−x2|), c2 sqrt(|y1−y2|)) because this is the time it would take the machine to accelerate at a constant rate from (x1, y1) to the halfway point, then decelerate to come to rest at (x2, y2). The constants c1 and c2 are related to the rates of acceleration in the x and y axes respectively, and are henceforth ignored for clarity of presentation. To relate this "square-root" norm to the Euclidean metric, note that if the square root distance between two points is a value d, then the actual distance in each dimension is no more than d^2, and the total Euclidean distance can be no more than sqrt(2) d^2. Thus if we wish to find all points within problem-specific distance d of a given point, it suffices to find all points within Euclidean distance sqrt(2) d^2, to calculate the problem-specific distance of each these points, and to eliminate points that are at distance greater than d.

This allows the relevant problem-specific computation to be done with nearly the efficiency of a standard calculation, with minimal modification; specifically, the geometric routines are called with transformed parameters (sqrt(2) d^2 instead of d, for example) and their outputs modified (to eliminate extraneous points) but the geometric procedures themselves are entirely unchanged.

Figure 4:
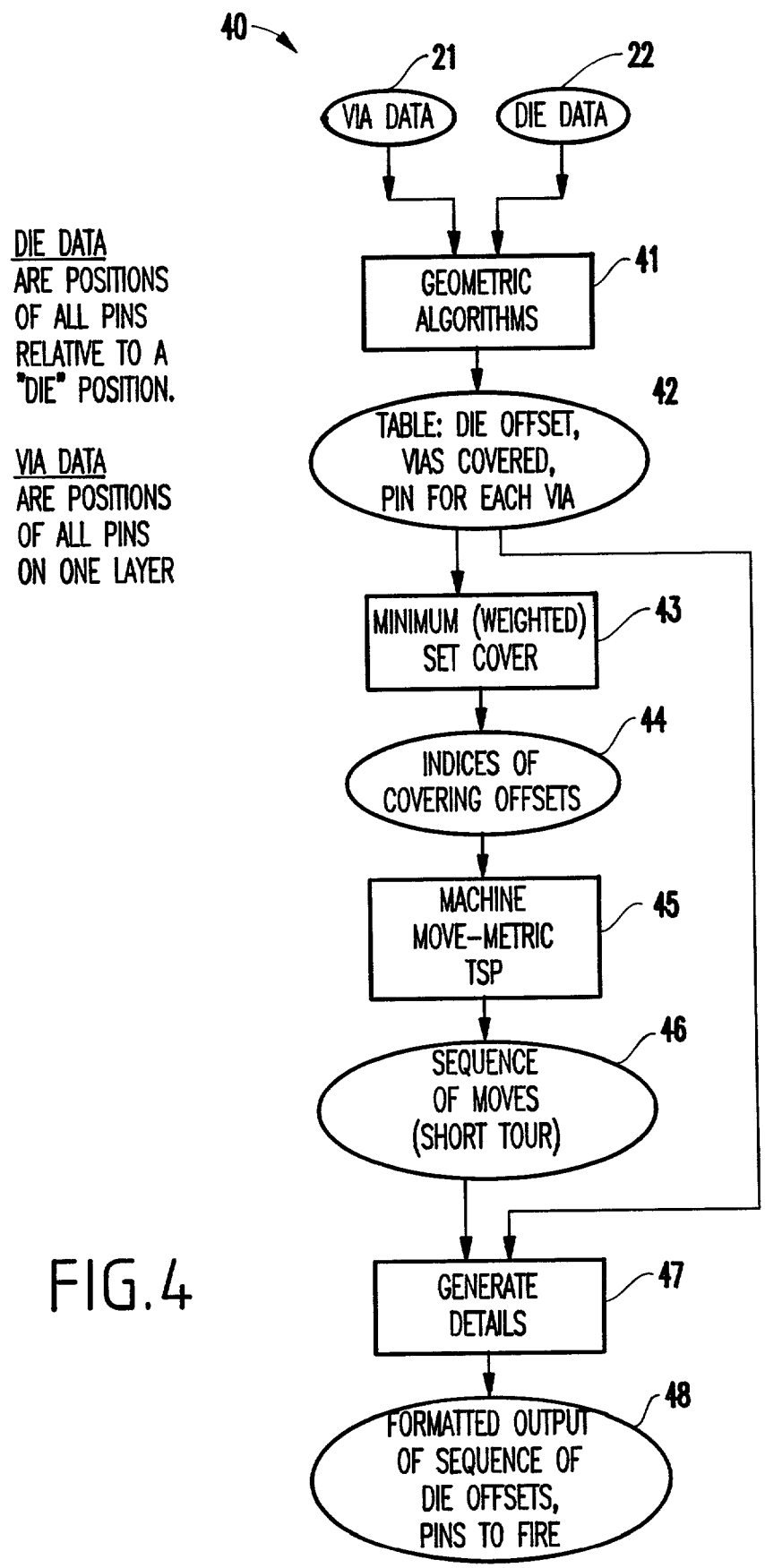
FIG. 4 is one preferred exemplary embodiment of the first aspect of the present invention, in which a set cover heuristic and a TSP heuristic are used to solve the GTSP.

This preferred embodiment is also described by FIG. 4. Input data 21 and 22 of FIG. 4 correspond to those of FIG. 2, and the steps (1), (2) and (3) described above are summarized by module 41, corresponding to module 23. Data 42 are equivalent to data 26. Module 43 corresponds to module 24A of FIG. 2A, data 44 to the data extracted by module 24D, and the module 45 to module 24B. Likewise the module 47 corresponds to module 28 of FIG. 2, and data 48 to data 29.

This concludes the description of a preferred embodiment of the first punch aspect of the invention, in which the GTSP solver 24 is embodied using a set cover solver 24A and a TSP solver 24B. We now consider a generalization of the procedure recently described for adapting a TSP solver to the square root metric. For reasons of narrative flow, this "third" aspect of the invention is described before introducing the "second" aspect of die optimization.

Many geometric solvers, not restricted to TSP solvers but also including Steiner-tree solvers, "k-median" solvers, and other such problems, even if they do not use construction and improvement heuristics as we have described, incorporate a solver-specific metric such as the Euclidean metric. In many such cases, the method we have just described by example can be use to adapt the solver to a problem-specific metric. This adaptation, a third novel aspect of our invention is described with reference to FIG. 5. Input data 51 is provided to a solver 52, which is to produce output data 56 describing a solution. (In the case of a TSP solver, 51 consists of city coordinates and 56 of a sequence of the cities making for a short tour in a problem-specific metric.) The adaptive method is suitable when the solver 52 has a structure including an optimization component 54, a "nearness" component 53 which computes all cities within an input distance d, in a solver-specific metric, of an input point x, and a "distance" component 55 which computes the solver-specific metric between two input points. The adaptation consists, first, of replacing 55 with a component 55B computing the problem-specific metric, rather than the solver-specific metric. Distance computations are generally very simple, and so this replacement is easy if the module 55 is an isolated component; it will be understood that if computations in the role of 55 are distributed through the solver 51, but can nonetheless be identified, the method is equally applicable. Second, a simple preprocessing component 53A and postprocessing component 53B are added to component 53. Given an input pair (d,x), preprocessor 53A replaces d with f(d), where two points within distance d of one another in the problem-specific metric are always within distance f(d) of one another in the solver-specific metric. Given a set of output point pairs (x,y) and problem-specific distance d, postprocessor 53B passes any pair for which the distance between x and y is d or smaller, and discards any pair for which the distance between x and y is greater than d. The replacement of the solver's distance function 55 with an application-specific metric 55B, and addition of the modules 53A and 53B, with no change to modules 54 or 53 nor the overall flow 52, adapts the solver to an application-specific metric. This adaptation of standard geometric solvers, such as TSP solvers designed for the Euclidean metric, to special-purpose metrics, such as a numerically controlled machine's motion time, is believed to be a novel aspect of the present invention.

Figure 6:
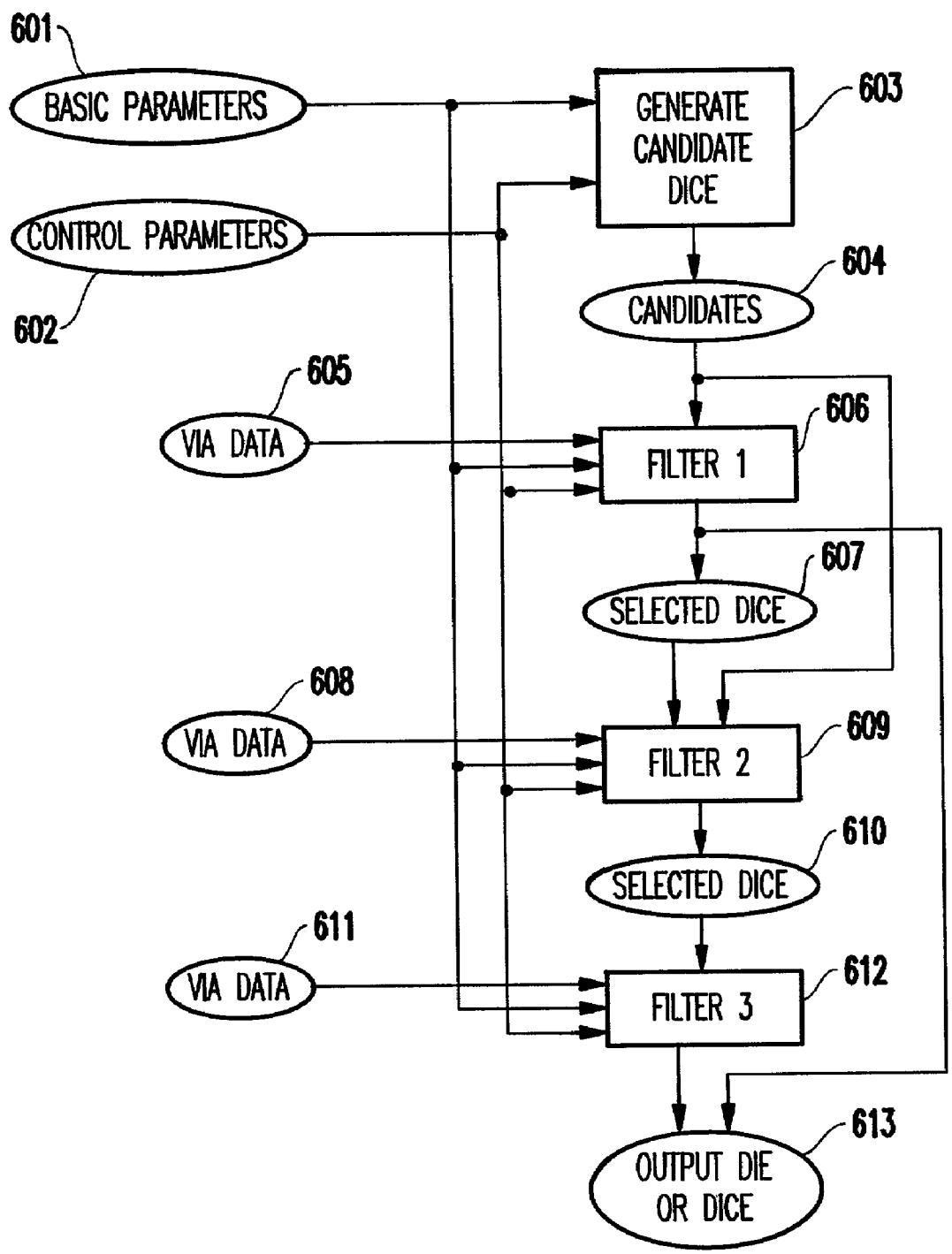
FIG. 6 shows an exemplary embodiment of the second aspect of the invention, that of MLC die design.

Described above is how the first aspect of the present invention, punch operation optimization, is formulated as a GTSP instance in one preferred embodiment and, in a further preferred implementation, how the GTSP is solved through formulation and solution of a set cover instance, followed by formulation and solution of a TSP instance. Also explained is the third aspect of the invention, the adaptation of a geometric solver to a problem-specific metric. The second aspect of the present invention is the problem of die optimization, as shown in FIG. 6.

The problem of optimizing a die for a single green-sheet design is first addressed, followed by a consideration of variant problems. Because similar procedures could apply to other manufacturing optimization problems, the disclosed technique can be described in more general terms of optimizing a "design", which is in this exemplary case a die design.

In summary, the technique includes a generation of all designs within some restricted class and the application of a multi-stage filtering procedure. A first "filter" estimates the efficiency of each die and "passes" a proportion of designs with best measurements. For example, the highest-scoring 1000 designs, the highest 10%, or all designs scoring above a certain value might be passed along as output of the first filter.

The designs that pass are subjected to a second filter, which again passes some proportion of the designs, for example, the highest-scoring 100 of the previous 1000, or the highest 30%, or all designs scoring above a certain value. Subsequent filters are applied similarly, each to the designs passing previous phases.

In current practice of the implemented present invention, a final decision is made by a person. In this case, the final filter might return just a single design selection for the person's approval, or might return a manageable number of selections from which the person will select one. In a preferred implementation, all designs in the restricted class are generated, then the first filter is applied to all of them, followed by application of the second filter to all designs passed by the first filter, and so forth. Other possibilities include, for example, passing candidates through the first filter as soon as they are generated, rejecting candidates whose scores fall below some threshold While the general case of a multi-stage filtering procedure has been described, it should be obvious that the case where the procedure consists of just a single stage is not excluded as an alternative embodiment of the present invention.

This basic concept is proposed as a novel method for manufacturing optimization for combinatorial designs and is applicable in a variety of realms. For example, in designing a furnace for firing silicon or ceramic parts, furnace parameters might include length, width, height, shape, heat entrance points, door locations, and so forth, and desiderata might include temperature uniformity or approximation of a desired temperature profile, time to change temperatures or temperature profiles, operating cost, and manufacturing cost. In another example, electronic equipment can be electrically tested with robotic probes. If several probes are used, the problem of minimizing total probe time is very similar to the punch problem described above, and the problem of designing an optimal probe array very similar to that of designing an optimal punch die.

In all these cases, the design problem is difficult, and the parameters may interact; for example, placing one electrical probe a bit further to the right might be beneficial, and the same might be true of a second probe, and yet placing both of them to the right could be deleterious. However, in these cases and others, it may be relatively simple to enumerate all designs, or a class of reasonable designs. It may also be the case that there exist one or more models of the machine's use, enabling any design's quality to be evaluated. We propose a system which uses a means for generating designs, and one or more means, of varying degrees of accuracy and of computational complexity, for evaluating a design, said system providing an efficient means of discovering a good or optimal design.

The die optimization solution is now described in greater detail with reference to FIG. 6. In the simplest example, the "restricted class" of dice generated will be "regular" dice. The "up" pattern of such a die will also match the up pattern of the target green sheet, the "up" parameters comprising part of the basic parameters 601. That is, each "up" will have the same pin pattern, and each pattern will consist of a rectangular array of pins, m pins across the X dimension and n across the Y dimension, with separations of dx in the X dimension and dy in the Y dimension. The separations dx and dy are to be multiples of a given underlying pitch, again part of data 601, and often the same for X and Y, but not necessarily so. An "up" pattern being independently fixed by data 601, a die design is then completely specified by the four values m, n, dx, and dy.

Constraints on a die, also specified in data 601, may include the total number of pins allowed (an upper bound on m times n times the number of ups), the minimum spacing between pins (lower bounds on dx and dy, as well as on the gap between a rightmost pin in one up and the corresponding leftmost pin in the up to its right, and the symmetrical gap in the Y dimension), the size of the die design (the distance between a leftmost and rightmost pin and the symmetrical distance in the Y dimension), the ability to reach any point in the design window with some pin (so that a "window frame" dimension, minus the size of the design, is at least dx in the X dimension, and at least dy in the Y dimension). Other constraints may also apply.

Generating in step 603 all legal 4-tuples (m,n,dx,dy) is fairly straightforward. In a preferred implementation, all pitch multiples dx are enumerated, allowing at least two pins across to fit in an up. For each pitch dx, then enumerated are all values of m allowing m pins to fit in an up, including m=1. Elimination of combinations which do not allow each X offset to be reached, or violate another constraint, is performed. The same steps for dy and n are performed. In some cases, vias lie primarily on even multiples of the pitch, in which case the control parameters 602 may include a specification that dx and dy are only to take values equal to even multiples of the pitch.

All pairings of pairs (dx,m) and pairs (dy,n) are taken, to form 4-tuples (m,n,dx,dy). Those for which mn times the number of ups exceeds the number of allowed pins are eliminated. This yields the set of all regular dice, represented as data 604. In practice it may consist a few thousand die designs.

Now described are three exemplary filtering stages that may be applied to these dice.

To begin, a second filtering stage 609 rather than a first stage 606, is described because the first will be more easily understood after the second. The second filter gives, not the minimum number of strokes required to punch a via pattern, but the number required in a "zone cover" system now to be explained.

The second filtering stage 609 is described with reference to FIG. 7.

Imagine a first "basic position" 701 in which the die's uppermost pin row (pins indicated by bold dots) is aligned with an uppermost via in the design (vias indicated by crosses), and its leftmost row with a leftmost via. From each pin, project a rectangular cell bounded by the pin below and right of it. From bottom-most or rightmost pins, a cell of the same size as the others is projected. For example, pin 702 defines cell 703. Each cell includes its top and left boundaries, but excludes its right and bottom boundaries. If there are several "ups", this is done separately for each up. In fact, since all "ups" are by definition identical, it suffices to consider just a single representative "up".

For the zone cover, an artificial constraint is made that each via in a cell must be punched by the cell's top-left pin. These are considered as "small moves" from the first basic position. The union of the cells described is a large rectangle, and the vias within it are "covered" by the first basic position.

Figure 7:
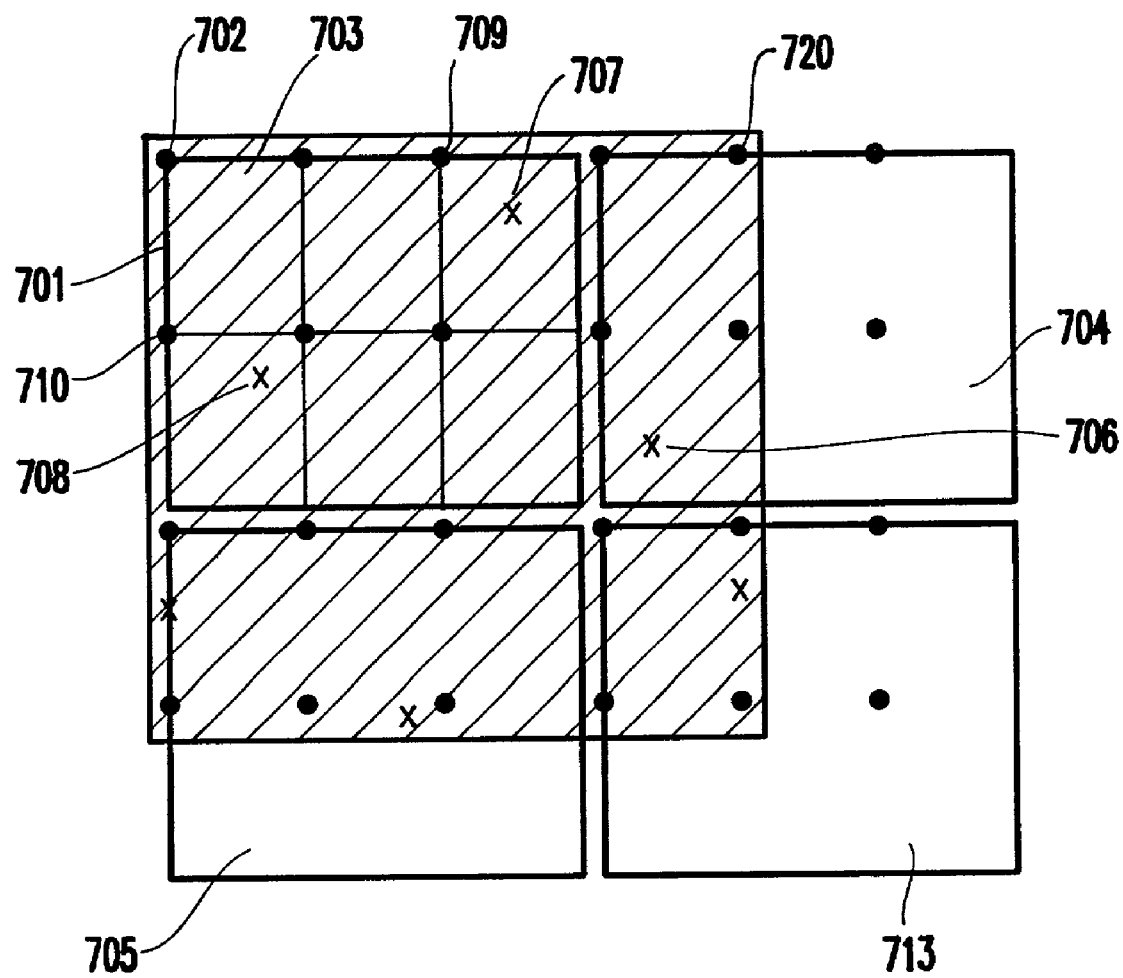
FIG. 7 illustrates the "zone cover" setup.

If the via area 720 extends beyond this first rectangle, then they are similarly covered by other basic positions defined by a rectangular tiling of the plane by the first large rectangle 701 and other rectangles of the same dimensions, shown in FIG. 7 as rectangles 713, 704, and 705. So for example, vias slightly to the right of the coverage area of the first basic position would instead be covered by a large shift of the die to the right, so that the die's top left pin aligns with the top right corner of the first coverage area. In the figure, via 706 is covered by the large shift corresponding to rectangle 704. Within each large rectangular area, the procedure described for the first basic position is repeated.

To compute the stroke count required in this zone cover model is simple. Compute the coverage size of a large rectangle. This size $(r\_x, r\_y)=(m\ dx, n\ dy)$ is the area spanned from the top left pin to the bottom right one, extended by the offset from one pin to the pin below and right of it. The plane is tiled with rectangles of this size, and for each via, the rectangle $(n\_x, n\_y)$ in which it lies is computed. For example, a via lying at an (x,y) position (0.7, 1.2) times the dimensions of the basic rectangle lies in the 1st rectangle in the x direction, and the 2nd one in the y direction, i.e, in rectangle (1,2). Each basic rectangle is formed of cells of some dimensions (dx, dy) as described.

For each via, it does not matter which cell the via occupies, only its position within the cell. For a via at position (x,y), this within-cell relative position is (x modulo dx, y modulo dy). A via lying in rectangle $(n\_x, n\_y)$ at relative offset (x', y') requires a punch offset of $(n\_x\ r\_x+x', n\_y\ r\_y+y')$, comprised of a "major offset" $(n\_x\ r\_x, n\_y\ r\_y)$ to the appropriate large rectangle, and a small relative offset (x', y') within that. The stroke count is simply the number of distinct tuples $(n\_x, n\_y, x', y')$ defined by the set of all vias. For example, vias 707 and 708 have the same major offset (rectangle 701) and the same minor offset, i.e., the same relative offset with respect to their specified pins 709 and 710, and so they will be punched in the same stroke.

After all tuples are generated, the number of distinct tuples is easily enumerated, for example by sorting the tuples lexicographically. Tuples differing in (x',y') by minute quantities should ideally be treated as equal. For purposes of the "zone cover" filter, this can be approximated by first rounding each (x',y') to the nearest point on a zero-centered lattice.

In a preferred implementation, the lattice spacing is an integer fraction of the underlying grid size, and no more than half the allowable error tolerance. Choosing the lattice size this small ensures that any points treated as equal can all be punched at once within the allowable error, while choosing the size to be an integer fraction of the underlying grid size means that when points are very near a grid coordinate, as is typical, they will get rounded to that grid coordinate, and thus it creates a tendency for points that can be punched concurrently to round to the same value. It can occur that nearby points will be rounded differently, but this only means that the solution is suboptimal; it remains a good estimate (and an upper bound).

In fact, the zone cover solution inherently can be suboptimal, because of the aforesaid artificial constraint imposed, but again, it gives a good estimate and can be computed quickly. The zone cover may also technically be infeasible, in the sense that some of its offsets may violate a maximum-offset constraint. However, if this occurs, it is easy to transform the zone cover solution to a feasible solution of at most the same stroke count: For any over-large offset, reduce the x component by the smallest multiple of dx to bring it within bounds, and similarly reduce y. If, as in the filtering application, only about the stroke count and not the strokes themselves are significant, it is enough to know that a transformation exists. There is no need actually to perform it.

The first stage "area" filter is a simplification of the zone filter, based on the assumption that every grid point within the design area is occupied by a via. Although per se this is far from the truth, it yields an approximation that can be useful for some circumstances. It is likely that some vias will force every possible major positioning $(n\_x, n\_y)$ as described above, and within each such positioning, while a relative offset (x', y') is likely not to be occupied by a via in any one particular cell, it is likely to be occupied in some cell or another. For a punch with cell sizes (dx, dy), measured in grid units, and large rectangle size $(r\_x, r\_y)$, and a via design area $(v\_x, v\_y)$, this gives a stroke count estimate of $[dx\ (floor(v\_x/r\_x)+min(1, (v\_x\ mod\ r\_x)/dx))]$ times
$[dy\ (floor(v\_y/r\_y)+min(1, (v\_y\ mod\ r\_y)/dy))]$.

In each of the X and Y terms, the first term accounts for large rectangles lying completely within the design area, and the second term accounts for partial rectangles. For the second term especially, the assumption that the every relative offset is occupied by some via can be inaccurate. For example, there may be only one relevant cell, in which case the "fill" probability is much smaller than the usual case with mn analogous cells, where we recall that the die is specified by the 4-tuple (m,n,dx,dy), and that the number of cells within a large rectangle is also mn. The formula can be refined, with no significant increase in computational complexity.

For example, consider a probabilistic model in which each grid point "site" is, independently, occupied by a via with probability p. In this case, the probability that at least one of k given sites is occupied is $fill(k)=1-Pois\_pk(0)=1-exp(-pk)$.

A better estimate of the zone cover stroke count is then:
$dx\ dy\ [floor(v\_x/r\_x)\ floor(v\_y/r\_y)\ fill(mn)+$
  $floor(v\_y/r\_y)\ fill(mn\ (v\_x\ mod\ r\_x)/r\_x))+$
  $floor(v\_x/r\_x)\ fill(mn\ (v\_y\ mod\ r\_y)/r\_y)+$
  $fill(mn\ ((v\_x\ mod\ r\_x)/r\_x)\ ((v\_y\ mod\ r\_y)/r\_y))]$.

Regardless of the detailed formulas used, this first-stage filter by definition produces an estimated stroke count or estimated total punch time depending only on the punch parameters and design parameters such as the active area and via density, and not on the actual via positions. Because the estimate does not depend on the vias, the time to compute it is independent of the number of vias. Thus, it is a very fast calculation that would be useful to pre-order a die when little information about the pattern to be punched is available, or to provide a quick estimate even when more specific information is available.

An exemplary third stage filter 612 uses the methods discussed under "punch optimization" to calculate, from the via and punch designs, an optimal or near-optimal stroke count, or an optimal or near-optimal estimate of total punch time based on machine motion and punching time. The procedures for producing these estimates within this "die optimization" phase may be, but do not have to be, the same procedures used in the actual punch optimization phase.

In a preferred implementation, to design a die for a collection of green sheet layers, for example, for all layers in one package, the first step is the enumeration of all regular die designs, as described above. These die designs are evaluated based on a sample of one or more "green sheet" layers from the package. For example, in a package with a large number of layers, ten layers evenly spaced through the package might be sampled.

The above "first filter" is not used. Rather, the initial filtering, consists of applying the above "second filter" to every candidate die design and every sample layer. Some number specified by data 602, say 20, of the dice with smallest second-filter stroke counts summed over the sample layers, are selected. These dice are then subjected to the third filter, which returns as the solution a single die (or several dice, again as specified by control parameters 602) having smallest third-filter stroke count summed over the sample layers.

This concludes the detailed description of the optimization of a die for a collection of green sheet layers. In general, for the optimization of machine designs, after the design enumeration phase, in a preferred embodiment, the final filtering stage should use the most accurate machine model available, while earlier filters may use faster-to-compute abstractions of the model.

For die design, a few variant problems are considered. It is sometimes necessary to design a die for a ceramic package whose detailed design is not yet known but whose basic parameters are known. These parameters should include active via area, grid pitch, and possibly via occupation probability and other parameters. Similarly, it may be desirable to design a die which will work well for future packages whose design details cannot be predicted but whose basic parameters are known. In this case, in a preferred implementation, all regular dice are generated, and the first-stage filter described above is used to evaluate each die on each parametrized layer. The die with smallest stroke count summed over all layers is returned. If all layers will have the same parameters (for example, if the via occupation probability is the same for all layers, or if this probability is neglected in the particular form of the first filter used), then it suffices to evaluate on a single parametrized layer.

Especially for packages that will be produced in large volumes, it may practicable to fabricate several different dice, using different dice to manufacture different layers. This is modeled as a multivariate optimization problem, seeking to minimize the total number of dice, the number of different kinds of dice, and the total punching time per package. In a preferred implementation, the punching time per package is sought to be minimized, with a bound K on the number of dice used, with no attention to whether these dice are the same or different. In a context where only a single time-estimation procedure is available, for example if detailed via information is unavailable, in a preferred implementation, all candidate dice are generated, and for each die, the "cost" of "covering" a layer is defined as being the estimated punching time. A set of K dice, not necessarily distinct, which cover all the layers at minimal or approximately minimal cost is returned. Such a set may be found by integer programming or by another combinatorial optimization method.

A preferred implementation, in a context where several time-estimating procedures are available and the more accurate ones are more computationally demanding, may again be discussed in reference to FIG. 6. In 603, all regular dice 604 are generated. For each die, the cost of covering a layer is in module 606 defined as the punching time as estimated by the first, quickest procedure. A set of dice covering all the layers at minimal or near-minimal cost is computed. Then, for the purpose of providing more candidate dice to subsequent filters, these die types are excluded from consideration. A second set of dice again covering all the layers at minimal or near-minimal cost is computed. This process is repeated some parametrized number of times, such as ten times.

Each cover may be found by integer programming or by another combinatorial method. This procedure, incorporated into module 606, results in a set of 10K dice, with at least 10 and at most 10K distinct dice, described by data 607. The distinct dice serve as the set of candidates for a next phase 609, where the second time-estimating procedure is employed. Again, minimum cover is repeatedly determined, for a smaller parametrized number of times, such as five times, producing data 610. This is repeated for each estimating procedure until, after the last estimate, in FIG. 6 shown as module 612, parameter 1 is used, returning a set of K dice, not necessarily distinct, covering all layers at minimal or near-minimal cost, and described by data 613.

Figure 8:
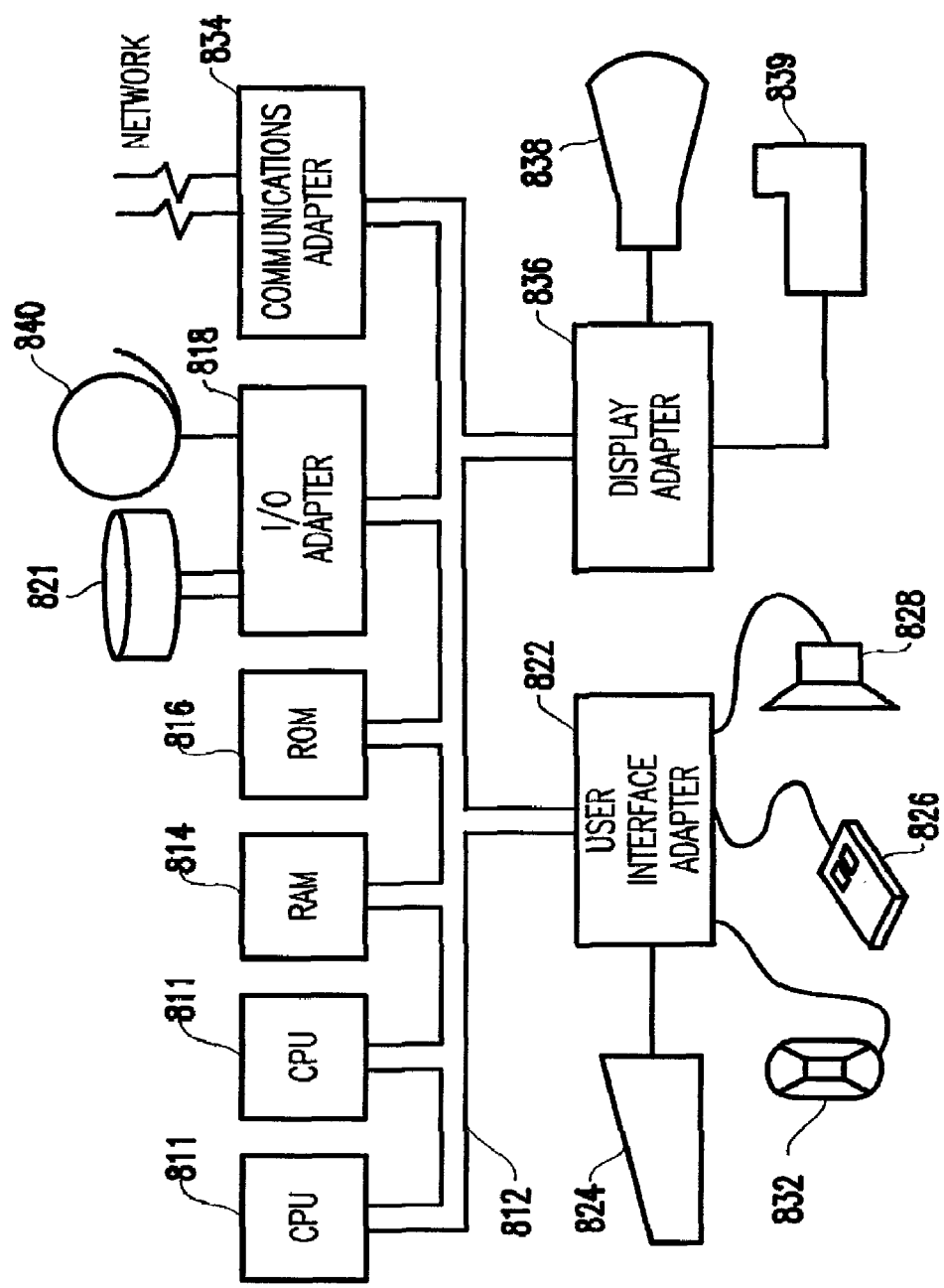
FIG. 8 illustrates an exemplary hardware/information handling system 800 for incorporating the present invention therein.

FIG. 8 illustrates a typical hardware configuration of an information handling/computer system in accordance with the invention and which preferably has at least one processor or central processing unit (CPU) 811.

The CPUs 811 are interconnected via a system bus 812 to a random access memory (RAM) 814, read-only memory (ROM) 816, input/output (I/O) adapter 818 (for connecting peripheral devices such as disk units 821 and tape drives 840 to the bus 812), user interface adapter 822 (for connecting a keyboard 824, mouse 826, speaker 828, microphone 832, and/or other user interface device to the bus 812), a communication adapter 834 for connecting an information handling system to a data processing network, the Internet, an Intranet, a personal area network (PAN), etc., and a display adapter 836 for connecting the bus 812 to a display device 838 and/or printer 839 (e.g., a digital printer or the like).

In addition to the hardware/software environment described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, comprising signal-bearing media tangibly embodying a program of machine-readable instructions executable by a digital data processor incorporating the CPU 811 and hardware above, to perform the method of the invention.

Figure 9:
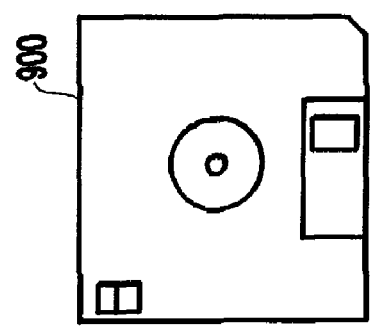
FIG. 9 illustrates a signal bearing medium 900 (e.g., storage medium) for storing steps of a program of a method according to the present invention.

This signal-bearing media may include, for example, a RAM contained within the CPU 811, as represented by the fast-access storage for example. Alternatively, the instructions may be contained in another signal-bearing media, such as a magnetic data storage diskette 900 (FIG. 9), directly or indirectly accessible by the CPU 811.

Whether contained in the diskette 900, the computer/CPU 811, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g. CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may comprise software object code, compiled from a language such as "C", etc.

Punch optimization and die optimization aspects both give a faster green sheet punching, larger throughput for fixed plant, and smaller capital investment for given throughput. Die optimization offers faster and better die design than human engineers can achieve.

There are analogous benefits for other manufacturing equipment using several equivalent operating units mounted in a fixed pattern—an array of electrical probes for circuit testing, or via punching or via drilling or other via formation processes for technologies other than MLC, whether older technologies like circuit boards or new technologies.

The machine-use optimization aspect of the present invention could also be applied to machines, such as multiple-arm robots, where the tools are not necessarily alike and where tool activity sites need not be in a fixed pattern. But where activity sites are constrained according to a machine model. For example, say, a left arm can only operate to the left of a right arm, and not too far away from it. Then similar means of constructing cities, and constructing and solving a GTSP, may be applied.

Geometric optimization problems arise in a huge variety of contexts, from TSP problems relating to delivery routes or efficient traversal of terminals on a circuit board, to "k-medians" problems of finding a set of hospital sites minimizing the distance from any person to the nearest hospital. It is an advantage of the present invention that an existing solver for any one of these problems, if of an appropriate form, may easily be modified from a solver-specific metric, such as the Euclidean metric, to a problem-specific metric, such as road travel time. This adaptation of existing solvers makes possible low development time and cost, with high-quality solutions.

In today's increasingly computerized environment, there will be increasingly many cases in which there exists a simulation model for a complex machine, the machine design is to be optimized, and there is no straightforward means of optimizing the design, but there are straightforward procedures for generating a reasonable class of machine designs; in such cases, the invention describes a means for designing a good or best machine.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of optimizing a manufacturing process, said method comprising:
    receiving, as input data, a description of a plurality of desired results of said process;
    receiving, as input data, capabilities of a machine to accomplish an operation;
    receiving, as input data, an operation space comprising a set of operations sufficient to accomplish all of said plurality of desired results using said machine capabilities;
    categorizing said operation space into groups, each said group corresponding to one of said plurality of desired results, any operation in the group sufficing to accomplish said corresponding one result, at least one said group comprising at least two alternative operations that each respectively accomplishes said one result; and
    selecting a subset of said operation space, said subset comprising at least one representative from each of said groups, thereby making it sufficient to accomplish all of said plurality of desired results.

2. A method of optimizing a manufacturing process, said method comprising:
    receiving, as input data, a description of a plurality of desired results of said process;
    receiving, as input data, capabilities of a machine to accomplish an operation;
    determining an operation space comprising a set of operations sufficient to accomplish all of said plurality of desired results using said machine capabilities;
    categorizing said operation space into groups, each said group corresponding to one of said plurality of desired results, any operation in the group sufficing to accomplish said corresponding one result, at least one said group comprising at least two operations;
    selecting a subset of said operation space, said subset comprising at least one representative from each of said groups, thereby making it sufficient to accomplish all of said plurality of desired results; and
    determining a short way to sequence the operations from said selected subset, wherein
    said operation space includes a set of cities, each city including a location and a set of desired results that may be performed from the city location,
    said categorizing into groups comprises a grouping of cities, each group including all the cities from which a particular desired result may be performed,
    said determination of a subset of the operation space comprises a selection of cities with at least one city from each group,
    said determining a short sequence of operations comprises determining an ordering of the cities defining a short traveling salesman tour, and
    said subset determination and said determination of a short sequence are expressible as an instance of a Generalized Traveling Salesman Problem (GTSP) and solvable by solving said GTSP.

3. The method of claim 2, wherein said determination of a subset is expressed as an instance of a Set Cover problem and solved by solving said Set Cover problem, and said determination of a short sequence is expressed as an instance of a Traveling Salesman Problem (TSP) and solved by solving said TSP.

4. The method of claim 2, wherein said manufacturing operation comprises one of the following:
    a punch operation involving a punch die having a plurality of pins;
    a drill operation involving a plurality of drill bits;
    a test probe operation involving a probe having a plurality of probe pins; and
    any of a variety of operations that can be performed by a multiple-arm robot having a variety of tools on said arms.

5. A method of optimizing a via-hole-punching operation for a multi-layer ceramic module, comprising:
    receiving, as input data, a description of a desired via pattern to be punched;
    receiving, as input data, a set of characteristics of a die having a plurality of punch pins;
    determining an operation space comprising a listing of reasonable offsets of a punch head holding a die with said characteristics that must be used to produce said desired via pattern;
    defining each said offset as a city, and associating with each city the set of all desired vias that may be punched with the die positioned at the city's offset;
    categorizing said cities into groups, wherein each said group is determined by one desired via, and said group includes all cities with which that via is associated;
    selecting a subset of cities comprising at least one city from each of said groups; and determining a short tour through said selected cities.

6. A method of optimizing a manufacturing tool design, said method comprising:

receiving, as input data, a description of a desired result of an operation of said tool;

receiving, as input data, a description of constraints of said tool design;

determining a design space comprising a set of possible tool designs that can accomplish said desired result; and selecting a design from said design space which is optimal or nearly optimal according to a prescribed measure.

7. The method of claim 6, wherein said selecting is accomplished by a design-evaluation process.

8. The method of claim 6, wherein said selecting comprises a sequence of filters, with each subsequent filter receiving only selected solutions from an immediately preceding filter, each said filter computing an approximation to said prescribed measure and each said filter providing a more precise approximation than a preceding filter.

9. The method of claim 6, wherein said tool comprises one of:
a punch die having a plurality of punch pins;
a test probe having a plurality of probe pins; and
a variety of tools on a multiple-arm robot, wherein at least two of said arms have a different tool.

10. A computer-implemented method of modifying a geometric solver having a solver-specific metric to adapt said solver to a problem-specific metric different from said solver-specific metric, said geometric solver having an optimization component, a nearness component receiving as inputs a point x and a distance d, said nearness component then computing all cities y within distance d of x, where said distance d is in a solver-specific metric, and a distance component to compute a solver-specific metric between two points input into said distance component, said method comprising:

replacing said solver-specific distance component with a problem-specific distance component; and adding to said nearness component a preprocessing component and a postprocessing component, wherein said preprocessing component replaces said input distance d with a value f(d), where f(d) is a distance such that where any two points within distance d of one another in said problem-specific metric are always within distance f(d) of one another in said solver-specific metric, and wherein said postprocessing component receives as an input a set of pairs of cities (x,y) and distance d and provides as an output only city pairs (x, y) for which the problem-specific metric distance between x and y is smaller than said input distance d.

11. The method of claim 10, wherein a problem solved by said solver comprises one of:
a General Traveling Salesman Problem (GTSP);
a Traveling Salesman Problem (TSP);
a Steiner tree problem; and
a k-median problem.

12. A signal-bearing medium tangibly embodying a program of machine-readable instructions executable by a digital processing apparatus to perform a method of optimizing a manufacturing process, said method comprising:

receiving, as input data, a description of a plurality of desired results of said process;

receiving, as input data, capabilities of a machine to accomplish an operation;

determining an operation space comprising a set of operations sufficient to accomplish all of said plurality of desired results using said machine capabilities;

categorizing said operation space into groups, each said group corresponding to one of said plurality of desired results, wherein any operation in the group sufficing to accomplish said corresponding one result, at least one said group comprising at least two alternative operations that each respectively accomplishes said one result; and selecting a subset of said operation space, said subset comprising at least one representative from each of said groups, thereby making it sufficient to accomplish all of said plurality of desired results.

13. The signal-bearing medium of claim 12, wherein
said operation space includes a set of cities, each city including a location and the set of desired results that may be performed from the city location,
said categorizing into groups comprises a grouping of cities, each group including all the cities from which a particular desired result may be performed,
said determination of a subset of the operation space comprises a selection of cities with at least one city from each group,
said determining a short sequence of operations comprises determining an ordering of the cities defining a short traveling salesman tour, and
said subset determination and said determination of a short sequence are expressible as an instance of a Generalized Traveling Salesman Problem (GTSP) and solvable by solving said GTSP.

14. The signal-bearing medium of claim 12, wherein said determination of a subset is expressed as an instance of a Set Cover problem and solved by solving said Set Cover problem, and said determination of a short sequence is expressed as an instance of a Traveling Salesman Problem (TSP) and solved by solving said TSP.

15. The signal-bearing medium of claim 12, wherein said manufacturing operation comprises one of the following:
a punch operation involving a punch die having a plurality of pins;
a drill operation involving a plurality of drill bits;
a test probe operation involving a probe having a plurality of probe pins; and
any of a variety of operations that can be performed by a multiple-arm robot having a variety of tools on said arms.

16. A signal-bearing medium tangibly embodying a program of machine-readable instructions executable by a digital processing apparatus to perform a method of optimizing a via-hole-punching operation for a multi-layer ceramic module, said method comprising:

receiving, as input data, a description of a desired via pattern to be punched;

receiving, as input data, a set of characteristics of a die having a plurality of punch pins;

determining an operation space comprising a listing of reasonable offsets of a punch head holding a die with said characteristics that must be used to produce said desired via pattern;

defining each said offset as a city, and associating with each city the set of all desired vias that may be punched with the die positioned at the city's offset;

categorizing said cities into groups, wherein each said group is determined by one desired via, and said group includes all cities with which that via is associated;

selecting a subset of cities comprising at least one city from each of said groups; and determining a short tour through said selected cities.

17. A signal-bearing medium tangibly embodying a program of machine-readable instructions executable by a digital processing apparatus to perform a method of optimizing a manufacturing tool design, said method comprising:

receiving, as input data, a description of a desired result of an operation of said tool;

receiving, as input data, a description of constraints of said tool design;

determining a design space comprising a set of possible tool designs that can accomplish said desired result; and selecting a design from said design space.

18. The signal-bearing medium of claim 17, wherein said selecting is accomplished by a design-evaluation process.

19. The signal-bearing medium of claim 17, wherein said selecting comprises a sequence of filters, with each subsequent filter receiving only selected solutions from an immediately preceding filter.

20. The signal-bearing medium of claim 17, wherein said tool comprises one of:

a punch die having a plurality of punch pins;

a test probe having a plurality of probe pins; and a variety of tools on a multiple-arm robot, wherein each said arm has potentially different tools.

21. A system implementing a method of optimizing a manufacturing process, said system comprising:

means for receiving input data comprising a description of a plurality of desired results of said process;

means for receiving input data comprising capabilities of a machine to accomplish an operation;

means for determining an operation space comprising a set of operations sufficient to accomplish all of said plurality of desired results using said machine capabilities;

means for categorizing said operation space into groups, each said group corresponding to one of said plurality of desired results, wherein any operation in the group sufficing to accomplish said corresponding one result, at least one said group comprising at least two alternative operations that each respectively accomplishes said one result; and means for selecting a subset of said operation space, said subset comprising at least one representative from each of said groups, thereby making it sufficient to accomplish all of said plurality of desired results.

22. A system implementing a method of optimizing a via-hole-punching process for a multi-layer ceramic module, comprising:

means for receiving input data comprising a description of a desired via pattern to be punched;

means for receiving input data comprising a set of characteristics of a die having a plurality of punch pins;

means for determining an operation space comprising a listing of reasonable offsets of a punch head holding a die with said characteristics that must be used to produce said desired via pattern;

means for defining each said offset as a city, and associating with each city the set of all desired vias that may be punched with the die positioned at the city's offset;

means for categorizing said cities into groups, wherein each said group is determined by one desired via, and said group includes all cities with which that via is associated;

means for selecting a subset of cities comprising at least one city from each of said groups; and means for determining a short tour through said selected cities.

23. A system implementing a method of optimizing a manufacturing tool design, said system comprising:

means for receiving, as input data, a description of a desired result of an operation of said tool;

means for receiving, as input data, a description of constraints of said tool design;

means for determining a design space comprising a set of possible tool designs that can accomplish said desired result; and means for selecting a design from said design space.

24. A system implementing a method of modifying a geometric solver having a solver-specific metric to adapt said solver to a problem-specific metric different from said solver-specific metric, said geometric solver having an optimization component, a nearness component receiving as inputs a point x and a distance d, said nearness component then computing all cities y within distance d of x, where said distance d is in a solver-specific metric, and a distance component to compute a solver-specific metric between two points input into said distance component, said system comprising:

means for replacing said solver-specific distance component with a problem-specific distance component; and means for adding to said nearness component a preprocessing component and a postprocessing component, wherein said preprocessing component replaces said input distance d with a value f(d), where f(d) is a distance such that where any two points within distance d of one another in said problem-specific metric are always within distance f(d) of one another in said solver-specific metric, and wherein said postprocessing component receives as an input a set of pairs of cities (x,y) and distance d and provides as an output only city pairs (x, y) for which the problem-specific metric distance between x and y is smaller than said input distance d.

* * * * *